United States Patent [19]

Gehman, Jr. et al.

[11] Patent Number: 5,501,006
[45] Date of Patent: Mar. 26, 1996

[54] METHOD FOR CONNECTION OF SIGNALS TO AN INTEGRATED CIRCUIT

[75] Inventors: John B. Gehman, Jr.; Richard P. O'Connell, both of Scottsdale, Ariz.

[73] Assignee: Motorola, Inc., Schaumburg, Ill.

[21] Appl. No.: 239,796

[22] Filed: May 9, 1994

Related U.S. Application Data

[62] Division of Ser. No. 124,786, Sep. 22, 1993, abandoned.
[51] Int. Cl.⁶ ............................................. H05K 3/34
[52] U.S. Cl. ..................... 29/840; 174/251; 257/668; 264/61
[58] Field of Search ..................... 174/251, 52.2; 29/854, 840; 257/668; 264/61

[56] References Cited

U.S. PATENT DOCUMENTS

| | | |
|---|---|---|
| 3,239,719 | 3/1966 | Shower . |
| 4,169,001 | 9/1979 | Kaiser ................................. 427/97 X |
| 5,164,817 | 11/1992 | Eisenstadt et al. . |
| 5,212,403 | 5/1993 | Nakanishi et al. . |
| 5,293,067 | 3/1994 | Thompson et al. . |

FOREIGN PATENT DOCUMENTS

| | | |
|---|---|---|
| 54-14672 | 2/1979 | Japan . |
| 60-218858 | 11/1985 | Japan . |
| 3-62525 | 3/1991 | Japan . |

*Primary Examiner*—Carl J. Arbes
*Attorney, Agent, or Firm*—Frank J. Bogacz

[57] ABSTRACT

A method and apparatus for connecting signal leads to an integrated circuit transmits a distribution signal on a lead. A substrate is provided with leads interconnecting a number of bonding pads. The integrated circuit has a corresponding number of bonding pads. An insulation layer is interposed between the integrated circuit and the substrate except for the bonding pads. The distribution lead is connected to the bonding pads on the substrate. The bonding pads of the substrate and the bonding pads of integrated circuit are interconnected. With this approach, signals may be distributed radially from a central point to equidistant circuits instead of sequentially or serially through a number of circuits.

6 Claims, 4 Drawing Sheets

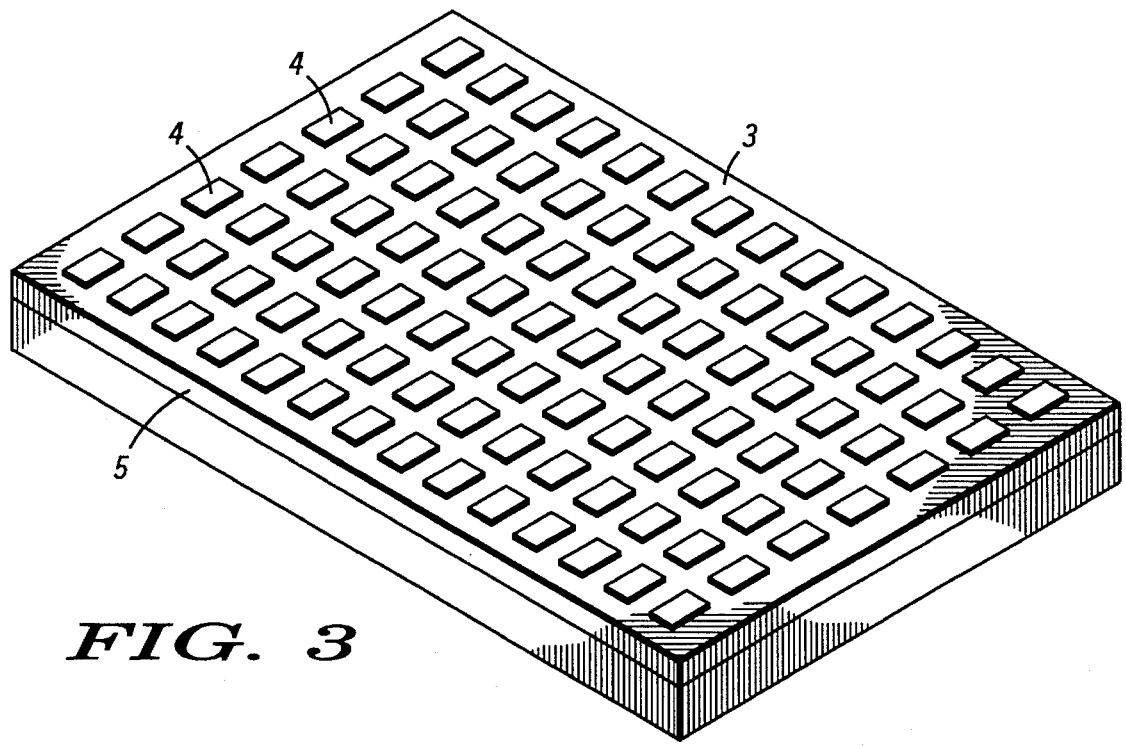
FIG. 3
FIG. 4
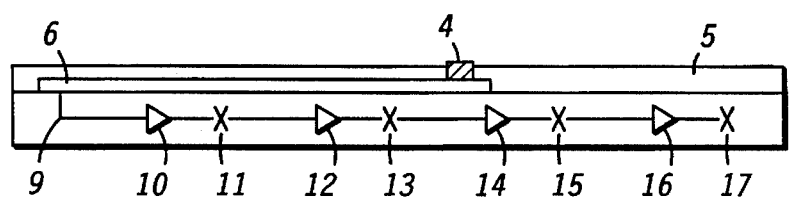

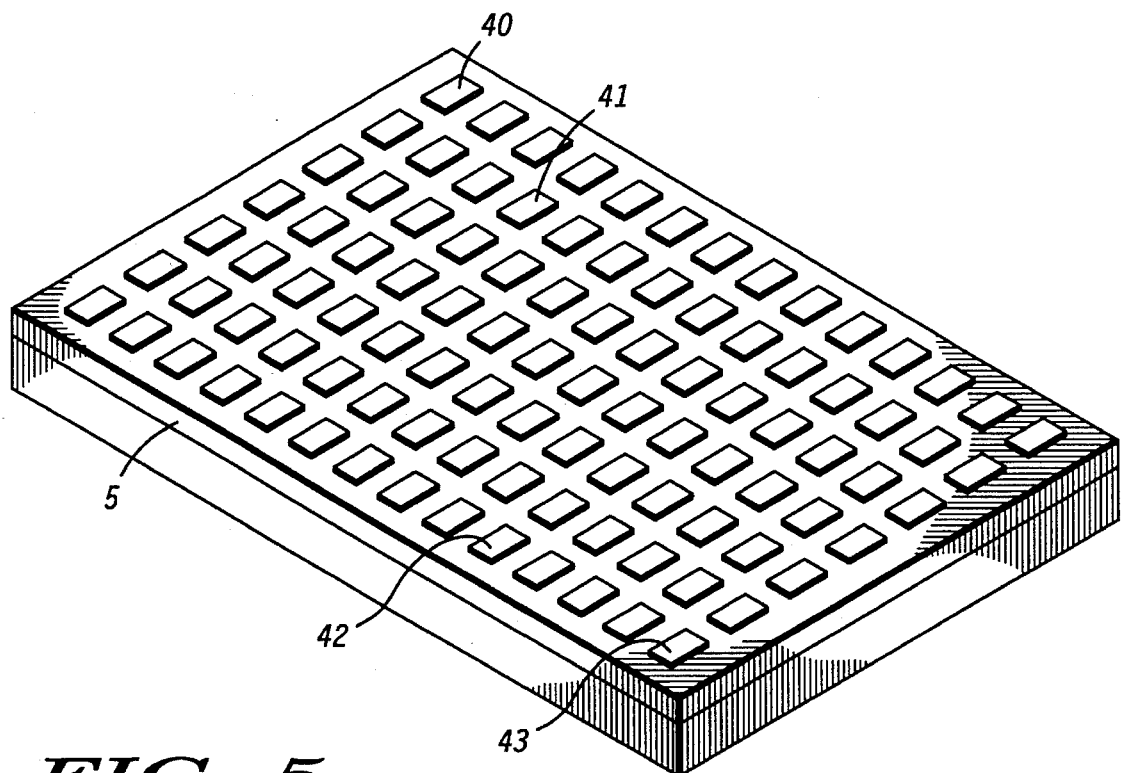
FIG. 5
FIG. 6
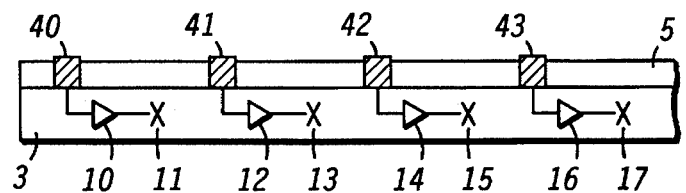

METHOD FOR CONNECTION OF SIGNALS TO AN INTEGRATED CIRCUIT

This is a division of application Ser. No. 08/124,786, filed Sep. 22, 1993 now abandoned.

BACKGROUND OF THE INVENTION

The present invention pertains to signal track reduction in complex array processors and more particularly to improving signal quality by transferring a signal from the periphery to the interior of a VLSI circuit (very large scale integrated circuit).

Shrinking geometries in VLSI wafer fabrication technology have caused transistor counts to increase. Improvements in manufacturing yield of wafer fabrication technology have caused sizes to grow. Signal leads are typically connected to VLSI circuits by bonding pads at the periphery of the circuit. These signals are then transferred from the bonding pads to the internal operational portions of the circuit by metal traces, leads, or tracks on the integrated circuit substrate. Since die sizes are growing larger, the ability to rapidly transfer electrical signals without losing signal quality from the periphery of a VLSI circuit to the interior is inhibited. This problem is exacerbated by the use of finer and finer line widths or tracks on the integrated circuit. As a result, propagation delays that were once considered insignificant through these tracks are now delayed substantially and synchronization of such signals is an important consideration in the design of VLSI circuitry. This is because long, thin tracks have high resistance and capacitance which increases losses and degrades the signal rise and fall times.

It is an advantage of the present invention to provide an arrangement for transferring widely distributed signals such as clock signals, power, and ground signals rapidly, without significant propagation delays, with minimal signal degradation and provide the ability to use wider tracks for the distribution of signals.

SUMMARY OF THE INVENTION

In accordance with the present invention, a novel method and apparatus for distribution of signals on a VLSI circuit is shown.

An arrangement for connecting signal leads to an integrated circuit has at least one distribution signal on a distribution lead to be connected. A substrate is included which has leads for transmitting the distribution signal to a plurality of locations on the substrate. The integrated circuit also includes a plurality of locations corresponding to the plurality of locations on the substrate. An insulation layer is interposed between the substrate and the integrated circuit which allows connection of only the two pluralities of locations. A connection connects the distribution lead to one location of the plurality of locations on the substrate. A plurality of interconnections connects the two pluralities of locations so that the distribution signal may be transmitted to the plurality of locations on the integrated circuit.

A method for connecting signals to an integrated circuit first provides a substrate with a distribution bonding pad which is connected to a first set of bonding pads. The integrated circuit has a second set of bonding pads which correspond to the first set of bonding pads. An insulation layer is applied between the integrated circuit and the substrate except for the two sets of bonding pads. The first and second sets of bonding pads are interconnected. The distribution lead is connected to the distribution bonding pad on the substrate for transmitting the distribution signal to the second set of bonding pads on the integrated circuit.

BRIEF DESCRIPTION OF THE DRAWING

FIG. 3 is an isometric view of a flip chip integrated circuit including redistribution adds according to the present invention.

FIG. 4 is a side view of the flip chip integrated circuit of FIG. 3.

FIG. 5 is an isometric view of a flip chip integrated circuit with optimized clock distribution according to the present invention.

FIG. 6 is a side view of the flip chip integrated circuit of FIG. 5.

DESCRIPTION OF THE PREFERRED EMBODIMENT

Figure 1:
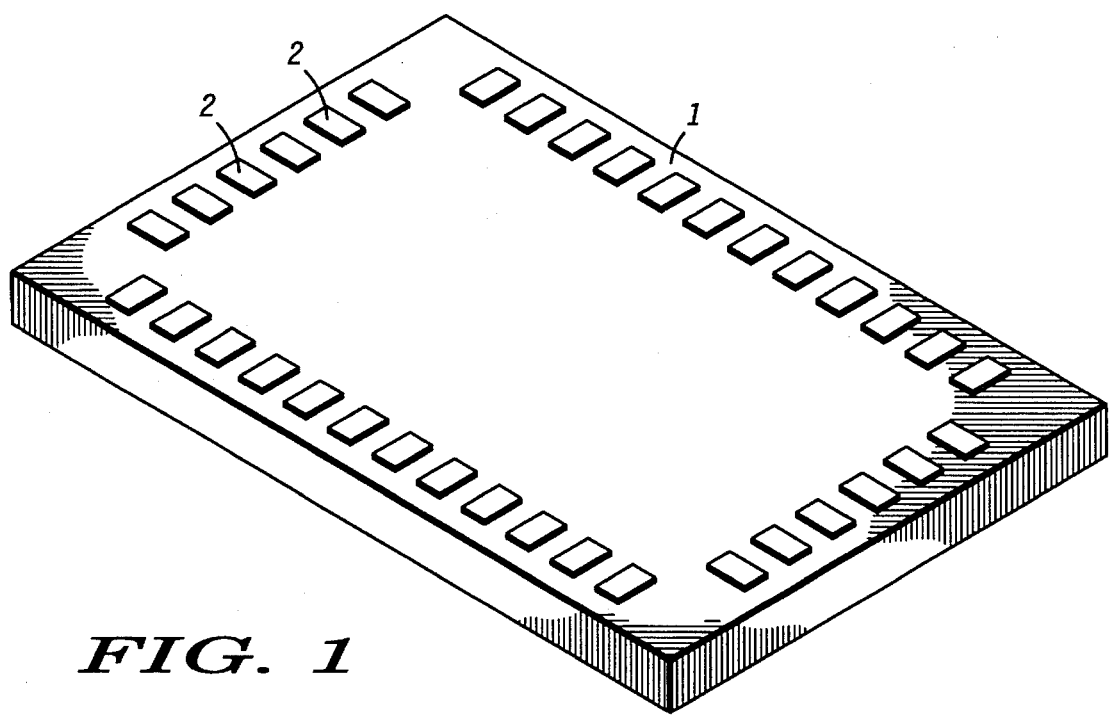
FIG. 1 is a prior art isometric view of a wire bonded integrated circuit.

FIG. 1 is a prior art isometric view of an integrated circuit (IC) 1 with wire bonding pads 2 for wire bonding interconnection of electrical signals to integrated circuit 1. Wire bonding pads 2 are disposed about the periphery of integrated circuit 1. These pads interconnect electrical input/output signals to and from integrated circuit 1.

Figure 2:
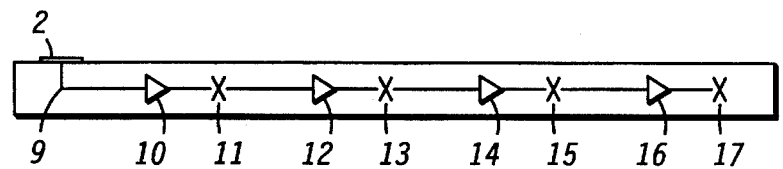
FIG. 2 is a side view of the integrated circuit of FIG. 1.

Referring to FIG. 2, a side view of integrated circuit of FIG. 1 is shown. Clock bonding pad 2 is shown as interconnecting an external clock signal via lead 9 to on-chip buffers 10, 12, 14, and 16. In addition, lead 9 transmits the clock signal to circuits 11, 13, 15, and 17. In such a serial connection of the clock signal through buffer 10 and circuit 11, buffer 12 and circuit 13, buffer 4 and circuit 15, to buffer 16 and circuit 17, it will be observed that there is a propagation delay from the time circuit 11 receives the clock signal until the time in which circuit 17 receives the clock signal. Although only four circuits are shown in FIG. 2, it will be really understood that many sequential circuits may be connected to the clock input and therefore the propagation delay between the first circuit to receive the clock signal and the last circuit to receive the clock signal is significant and affects the operation of integrated circuit 1.

FIG. 3 depicts a flip chip integrated circuit 3 with bonding pads such as 4 on the top surface of integrated circuit 3. Such integrated circuits are connected to circuit connections via a controlled collapsed chip connection (C4) process developed by the IBM Corporation.

Referring to FIG. 4, the circuit connections similar to FIG. 2 are shown. That is, lead 9 distributes the clock signal connected at bonding pad 4 via distribution lead 6 to buffers 10, 12, 14, and 16 and to circuits 11, 13, 15, and 17. Insulation layer 5 electrically isolates bonding pad 4 from any other electrical connection on integrated circuit 3. That is, any other signals coupled to the unnumbered bonding pads are electrically separated from the clock signal applied to bonding pad 4. As with the case of the wire bonded integrated circuit of FIGS. 1 and 2, the flip chip integrated circuit 3 of FIGS. 3 and 4 still has significant propagation delays of the clock signal via bonding pad 4 through track 6 and lead 9 through the buffers and circuits 10 through 17. Although, the clock signal has been used for purposes of explanation, the propagation delays of other signals transmitted to flip chip integrated circuit 3 may also be similarly affected as well as power and ground signals.

Referring to FIG. 5, a flip chip integrated circuit 3 optimized for clock distribution according to the present invention is shown. FIG. 5 depicts flip chip IC 3 including four bonding pads 40, 41, 42, and 43 which are to be interconnected to a clock lead. FIG. 6 depicts a side view of FIG. 5. Bonding pad 40 is connected to buffer 10 and in turn to circuit 11. Bonding pad 41 is connected to buffer 12 and in turn to circuit 13. Bonding pad 42 is connected to buffer 14 and in turn to circuit 15. Bonding pad 42 is connected to buffer 16 and in turn to circuit 17. Each of connections of a bonding pad 40, for example, to a buffer 10 and circuit 11 is a shorter direct connection than shown in FIGS. 1–4 which provides for a more synchronous operation of circuits 11, 13, 15, and 17.

Figure 7:
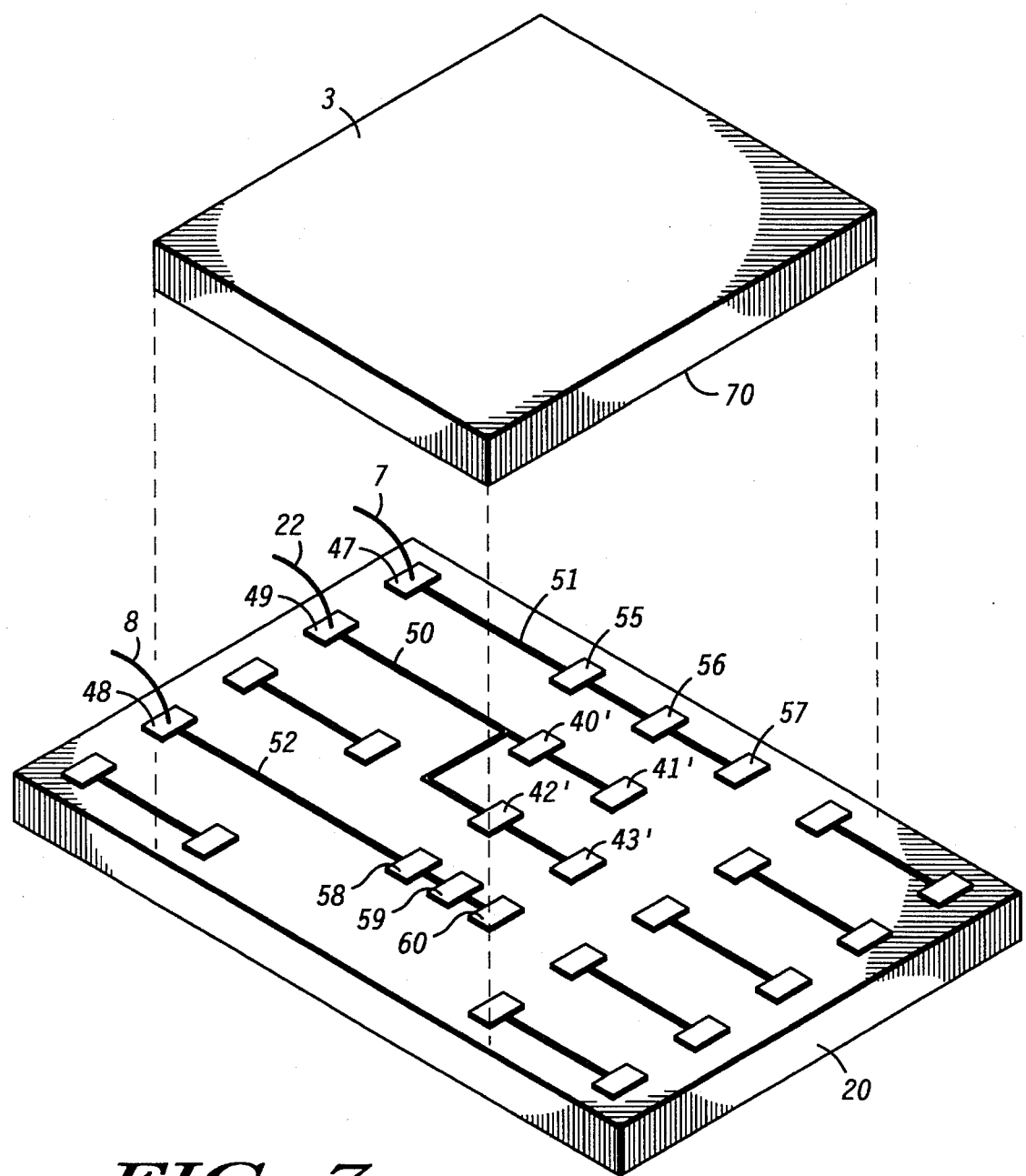
FIG. 7 is an isometric view of the flip chip interconnection of FIG. 5 in accordance with the present invention.

Referring to FIG. 7 an isometric view of a flip chip integrated circuit interconnection of FIG. 5 is shown. Integrated circuit 3 is shown upside down from that of FIG. 5. That is, the bonding pad connections are on the bottom surface 70 (not visible) of integrated circuit 3. Substrate 20 has edge or distribution bonding pads 47, 48, and 49. Bonding pad 47 is connected to lead 7. This connection may be by wire bonding. Bonding pad 48 is wire bonded to lead 8. Bonding pad 49 is wire bonded to lead 22. Lead 7 may carry the power to the integrated circuit and lead 8 the ground, for example.

As an example we shall focus upon lead 22 which supplies the clock signal to integrated circuit 3 via bonding pad 49. As other examples power may be distributed via bonding pad 47 via track 51 to a group of bonding pads 55, 56, and 57. Similarly, ground may be applied via bonding pad 48 through lead 52 to bonding pads 58, 59, and 60. Bonding pads 55 through 60 will come in contact with the appropriate pads on the bottom side of integrated circuit 3. To return to our example of the distribution of the clock signal on lead 22, through bonding pad 49 and track 50, the signal is transmitted to bonding pads 40', 41', 42', and 43'. When integrated circuit 3 is connected or bonded with the bonding pads 40' through 43' of substrate 20, connection is made in a one-for-one correspondence to bonding pads 40 through 43 of integrated circuit 3 as shown in FIG. 5. Through insulation layer 5 as shown in FIG. 6, each of the bonding pads 40 through 43 are connected to corresponding bonding pads 40' through 43' on the substrate 20 as shown in FIG. 7. Signals may then be transmitted to integrated circuit 3 through signal leads 7, 8, and 22, for example, and the corresponding bonding pads 47, 48, and 49 on the edge of substrate 20.

The C4 process is applied to connect integrated circuit 3, each of the bonding pads 40, 41, 42, and 43 receive the clock signal simultaneously and transmit it through insulation layer 5 to the appropriate buffer and circuit combination. That is, bonding pad combination 40–40' transmits the clock signal to buffer 10 and circuit 11; bonding pad combination 41–41' transmits the clock signal to buffer 12 and circuit 13; bonding pad combination 42–42' transmits the clock signal to buffer 14 and circuit 15; and bonding pad combination 43–43' transmits the clock signal to buffer 16 and bonding pad 17. The connection of the bonding pads of IC 3 to the bonding pads of substrate 20 may be accomplished by soldering, such as infrared reflow, vapor phase or hot plate soldering etc. As a result, the propagation delays associated with the circuits shown in FIGS. 1–4 are reduced by eliminating the long transmission lead 9 from the wire bonded integrated circuit and by eliminating the track 6 from the flip chip type integrated circuit shown in FIGS. 3 and 4.

Insulation layer 5 may be a glass (SiO2) layer and is interposed between IC 3 and substrate 20. Insulation layer 5 may also include a phosphorous doped glass SiO2) layer, a nitride layer or polyimide layer. It is to be noted that in FIG. 6 each bonding pad serves one buffer and circuit. This is by way of example only and bonding pads may serve several buffers and circuits without the introduction of a propagation delay of the clock signal. This arrangement works equally for power and ground distribution to the circuit as indicated above. Typically such circuits use many thin leads of power/ground connections for the transmission of power. This is electrically inefficient and increased the amount of power consumed by the device much of which was lost in the transmission. With the approach shown herein, power and ground may be transmitted via thicker tracks ("fat tracks") such as track 50 on top of substrate 20 and brought through the insulation layer 5 at the appropriate bonding pads where they are required to be connected. Standard tracks or leads for signal distribution on VLSI components are 1 to 2 microns (micrometers) in width. "Fat tracks" are considerably wider than standard tracks and depend on the power which they are required to transmit. For example, a "fat track" for transmitting from 1 to 2 amps of current would be approximately 600 microns (micrometers) in width. Therefore, an improved power distribution arrangement may also result. Since signals with rising and falling edges are transmitted rapidly and with minimal propagation delay, the circuit efficiency is improved and many timing design problems do not arise.

Substrate 20 may include a ceramic substrate, a laminate substrate, dielectric or silicon substrate. Such substrates are manufactured by CTS Corporation Microelectronics Division of West Lafayette, Ind., White Technologies or other such companies.

Faster rise and fall times allow faster clock and data transmission. Shorter propagation delays makes the IC run faster making it easier to match delays. Matching propagation delays enables higher integrated circuit (chip) performance. Losses in power distribution tracks degrade signal integrity by coupling wide data bus transmissions to the power tracks. Reducing the length of power busses minimizes disruption to signal quality and increases the silicon area available for functional circuitry.

It can readily be appreciated that in situations in which the apparatus of the present invention is employed, signals carrying information may be transmitted more rapidly with less propagation delay and less signal coupling into power and ground or information loss. For situations in which power or ground is transmitted, the amount power required is minimized since power is transmitted directly to the circuit points at which it is required without loss. Long leads dissipating much power and heat are eliminated. In addition, track 50 may be made as wide as necessary to transmit power without excessive power dissipation.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method for connecting a clock signal to an integrated circuit comprising the steps of:

provinding a substrate with at least one distribution bonding pad connected to a first set of bonding pads;

providing the clock signal on a distribution lead, said distribution lead being located within the substrate:

buffering within the substrate the clock signal;

providing the integrated circuit with a second set of bonding pads corresponding to the first set of bonding pads;

applying an insulation layer between the integrated circuit and the substrate except for the first and the second sets of bonding pads;

interconnecting the first and second sets of bonding pads; and connecting the distribution lead to the at least one distribution bonding pad of the substrate for transmitting the clock signal to the second set of bonding pads on the integrated circuit.

2. The method for connecting signal leads as claimed in claim 1, wherein there is further included the step of connecting the distribution bonding pads to particular ones of said first set of bonding pads.

3. The method of connecting signal leads as claimed in claim 1, wherein the step of applying includes the step of applying a phosphorous doped glass layer between the integrated circuit and the substrate, except for the first and second sets of bonding pads.

4. The method of connecting signal leads as claimed in claim 1, wherein the step of applying includes the step of applying a nitride layer between the integrated circuit and the substrate, except for the first and second sets of bonding pads.

5. The method of connecting signal leads as claimed in claim 1, wherein the step of applying includes the step of applying a polyimide layer between the integrated circuit and the substrate, except for the first and second sets of bonding pads.

6. The method for connecting signal leads as claimed in claim 1, wherein the step of interconnecting the first and second sets of bonding pads includes the step of soldering the first and second sets of bonding pads.

* * * * *